United States Patent [19]
Waldo, III

[11] Patent Number: 5,355,306
[45] Date of Patent: Oct. 11, 1994

[54] ALIGNMENT SYSTEM AND METHOD OF ALIGNMENT BY SYMMETRICAL AND ASYMMETRICAL ANALYSIS

[75] Inventor: Whitson G. Waldo, III, Madison, Wis.

[73] Assignee: Motorola, Inc., Schaumburg, Ill.

[21] Appl. No.: 128,427

[22] Filed: Sep. 30, 1993

[51] Int. Cl.$^5$ .............. G05B 19/18; G01J 1/00; G06F 15/46
[52] U.S. Cl. ............... 364/167.01; 364/559; 364/474.34; 364/474.35; 250/491.1
[58] Field of Search ............ 364/167.01, 488–491, 364/559, 468, 474.02, 474.15, 474.16, 474.18, 474.28, 474.34, 474.35; 250/491.2, 492.2, 203.1, 234; 356/394, 401, 356; 355/53; 395/904, 912, 920, 921

[56] References Cited
U.S. PATENT DOCUMENTS

| | | | |
|---|---|---|---|
| 4,122,335 | 10/1978 | Sullivan | 250/492.2 |
| 4,370,554 | 1/1983 | Bohlen et al. | 250/491.1 |
| 4,703,166 | 10/1987 | Bruning | 250/203.1 |
| 4,835,704 | 5/1989 | Eichelberger et al. | 364/490 |
| 4,923,301 | 5/1990 | White | 356/356 |
| 5,040,020 | 8/1991 | Rauschenbach et al. | 355/53 |
| 5,124,927 | 6/1992 | Hopewell et al. | 364/468 |
| 5,227,626 | 7/1993 | Okada et al. | 250/234 |
| 5,285,075 | 2/1994 | Minamide et al. | 250/491.1 |

*Primary Examiner*—Jerry Smith
*Assistant Examiner*—Jim Trammell
*Attorney, Agent, or Firm*—Miriam Jackson

[57] ABSTRACT

An alignment signal is analyzed asymmetrically using any means of artificial intelligence or similar logic to apply empirical or theoretical offsets to signal position calculations based on the unique signal shapes of the different signals collected. A database of signal shapes and correlated offsets is used to improve subsequent alignment steps. For example, a case-based reasoning method can be used.

11 Claims, 2 Drawing Sheets

ALIGNMENT SYSTEM AND METHOD OF ALIGNMENT BY SYMMETRICAL AND ASYMMETRICAL ANALYSIS

BACKGROUND OF THE INVENTION

This invention relates, in general, to photolithography, and more particularly, but not limited to, a method and a system for alignment.

Photolithography is used in the semiconductor chip manufacturing industry. The process for overlaying critical features from one mask layer to another is called alignment. Alignment systems actively use fiducial information on a current mask layer and on the semiconductor substrate of a previous mask layer to relate the spatial orientation of the two layers prior to transfer of the pattern on the mask layer to the substrate.

Alignment systems typically use of one to three mask targets or alignment marks, one to three semiconductor substrate targets, an optics system to collect and perhaps perform some optical processing of scattered light off the mask and wafer targets, and a software package that recognizes the alignment signal generated from the targets. The mask target and the semiconductor substrate target must be aligned to each other.

The alignment signal is generated by illuminating a target comprised of the mask and wafer targets with a light source. Light incident on the target is scattered. Depending upon the alignment system design, some or all of the scattered light is collected by an optics system. The collected light comprises the alignment signal. The signal must be processed to determine positional information of the targets.

The software package uses an algorithm to transform the alignment signal into positional information. Small adjustments are made mechanically by the alignment system in response to the software alignment error analysis to improve the positioning of the mask target relative to the substrate target. Pattern exposure begins after alignment is completed.

All current signal processing algorithms either assume the alignment signal is symmetric or attempt to extract out the symmetric portion of the signal for processing. Signal asymmetries are not accounted for in any quantitative fashion. Unfortunately, signal asymmetries are of paramount importance since they are responsible for offset errors. Because current signal processing algorithms don't account for signal asymmetries, these offset errors can appear as a random contribution enlarging alignment error. Signal asymmetries can be introduced by asymmetric aberrations in the optics, target asymmetry such as a profile difference from one side of the target to the other, an asymmetric defect in the target, an asymmetric film deposition (e.g., spun cast resist) that causes film thickness variations in the neighborhood of the target and so introduces variation in light absorption and scattered light off the target, among other things.

Prior art methods of alignment which attempt to minimize the effect of asymmetric signals include optical techniques using phase gratings to collect light at particular diffraction angles, and software methods applied to signals collected from scattered light.

The optical technique collects light over a finite aperture to minimize the effect of target or optical asymmetries, but this does not eliminate the effect. Software methods of signal processing for symmetrical analysis include, for example, taking the derivative of a time varying signal and finding the zero crossing point, using maximum likelihood statistical methods to find the symmetric center or threshold methods where slices are taken at particular signal intensity levels to find the symmetric center. These software methods process each signal individually; the analysis of the signal is then discarded.

These prior art signal processing methods will introduce alignment offsets or overlay errors if there are any signal asymmetries. The primary emphasis of these techniques is to attempt to create ideal targets and processing conditions which do not introduce asymmetries. While this is an admirable goal, it is difficult and costly to pursue this ideal in a manufacturing environment.

Thus, it would be desirable to eliminate the effect of asymmetric signals in the alignment process. Especially as feature sizes of semiconductor chips continue to shrink and the relative impact of signal asymmetries increases.

SUMMARY OF THE INVENTION

An alignment system and method of alignment is performed by first providing a lithographic tool and illuminating a target with a light generated from the lithographic tool. An amount of light diffracted off the target is collected to obtain a signal having positional information about the target. The signal is processed to obtain a symmetrical analysis of the signal. The signal is then processed to obtain an asymmetrical analysis of the signal. A correction based on a combination of the symmetrical analysis and the asymmetrical analysis is calculated. The lithographic tool is then actuated according to the correction.

DETAILED DESCRIPTION OF THE DRAWINGS

This invention comprises an alignment system that accounts for signal asymmetries. In its simplest form, it can supplement the usual symmetrical signal processing and provide a corrective term to alignment offset information. The characteristics of signals are examined more closely for asymmetries, correlated data of offsets for each asymmetric signal are found and the corrective term is applied to minimize the alignment offset error in near real time.

Figure 1:
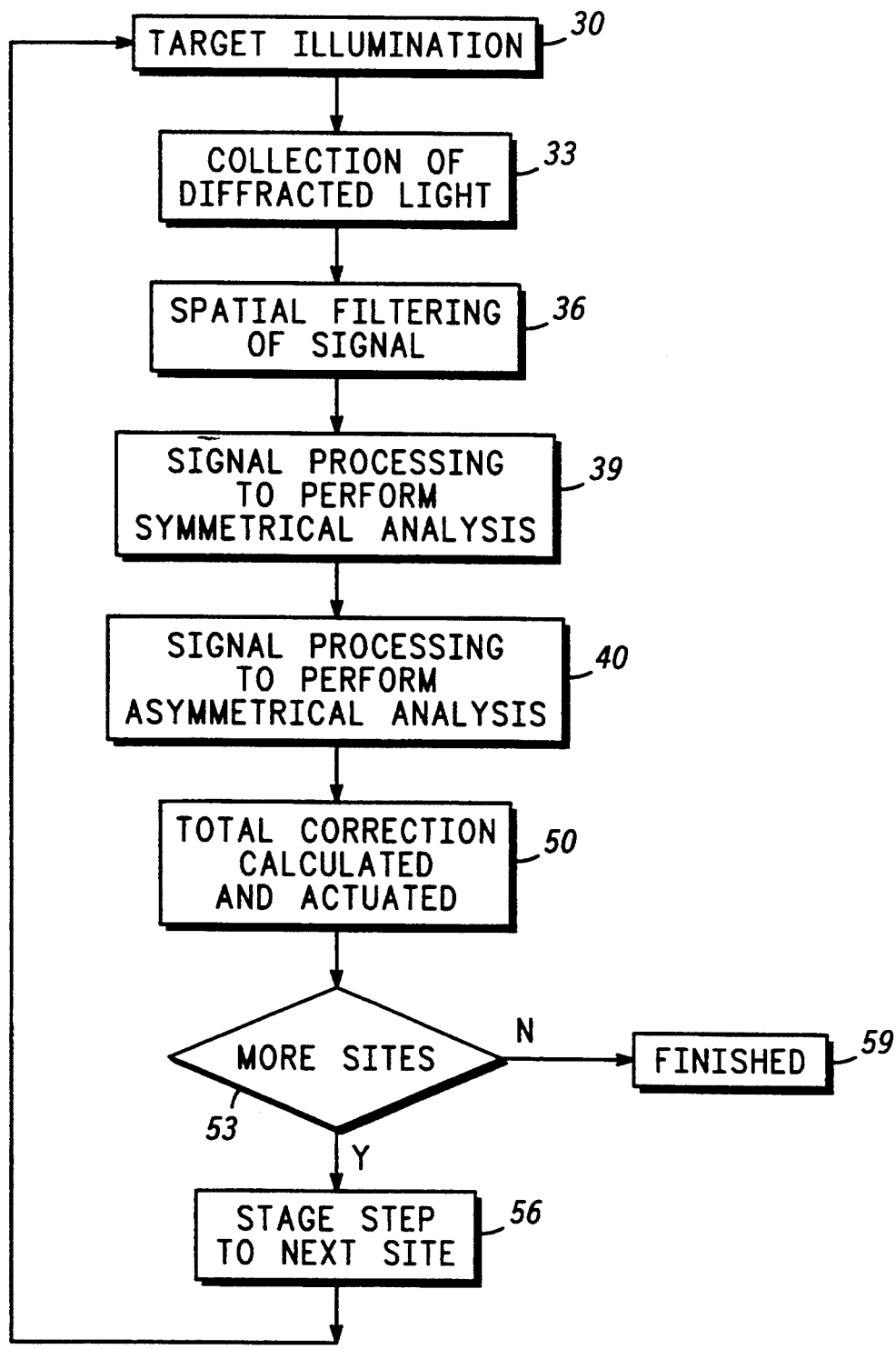
FIG. 1 illustrates a flow chart of an embodiment of the present invention.

FIG. 1 illustrates a flow chart of an alignment process using the method of the present invention. This flow chart is meant to diagram the logic for supplementing the conventional signal processing with software or hardware to separately recognize the impact of signal asymmetries and compensate for the effects. In the flow chart, target illumination step 30 describes the start of the alignment sequence where a wafer target and substrate target (a target) are illuminated by some light source. The step of collecting diffracted or scattered light 33 describes the operation where the light that is diffracted or scattered off the target is collected by the alignment optics system. This collected light has positional information about the target, but it needs to be processed. The light coming off the target also is affected by absorption, transmission, and reflection by the process and its films, and the shape, size, surface roughness, and composition of the target.

Spatial filtering of the signal 36 refers to hardware or software methods that attempt to reduce the influence of noise in the signal to improve the signal to noise ratio. This can be done by various digital filters or optically using a spatial filter. This step is not necessary, but is typically performed.

A means for processing a signal to obtain a symmetrical analysis of the signal is coupled to the lithographic tool. This can be accomplished by the use of software available with the lithographic tool. Symmetrical signal processing is performed in step 39. This can be accomplished by finding the centroid, which includes any edge position, centroid calculation, or phase measurement of the signal to determine positional information of the signal collected by the optics system. At this point, the signal is assumed to be symmetrical.

The signal is then asymmetrically processed in step 40 using any means of artificial intelligence or similar logic to apply empirical or theoretical offsets to signal position calculations based on the unique signal shapes of the different signals collected. This may include, for example, using a library based system, a comparative database, an algorithmic comparison, a comparison by mathematical description such as by Fourier transform, Fourier component analysis, power spectrum density description, or by establishing a threshold centroid signature, etc. As stated above, all prior art signal processing algorithms either assumed the alignment signal was symmetric or attempted to extract out the symmetric portion of the signal for processing; signal asymmetries were not accounted for in any quantitative fashion. In the present invention, the signal processing performed does account for asymmetries in a quantitative manner.

This additional signal processing capability provides for alignment error correction based on asymmetries in the signal. This capability is lacking in the prior art. A means for processing the signal to obtain the asymmetrical analysis of the signal in step 40 is coupled to the lithographic tool. A variety of software methods can be used to perform this analysis.

Extension of this technology permits positional feedback to be made correlated to signal shapes so alignment system learning or improvement is possible. Methodologies of signal shape comparison can be used so library signals can be compared to current signal shapes to find the closest correlation for application of a positional offset. Interpolation or extrapolation of positional offset values is possible according to well defined criteria. One example of implementing this invention is the use of the artificial intelligence method called case-based reasoning.

Figure 2:
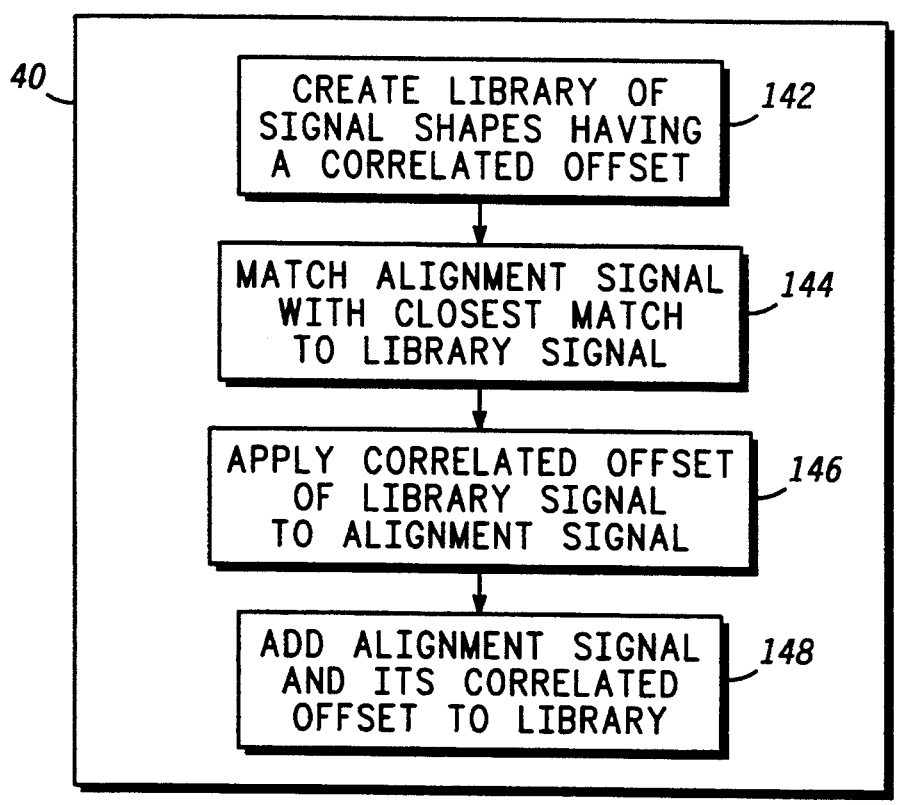
FIG. 2 illustrates a flow chart of a portion of an embodiment of the present invention.

One embodiment of case-based reasoning is shown in FIG. 2. Case-based reasoning can be carried out through software. In step 142, a library of signals would be established. Ideally, this library would include all unique signal shapes routinely processed. The signals are differentiated one from another by some form of identification. A library entry of this signal would include a correlated offset value determined either empirically or theoretically.

Case representation of the individual alignment signals by attributes or features provides for individual marking, identification, or description. For example, a signal might be identified using signal descriptors or mathematical expression to identify the signal shape, such as, for example, by Fourier transform or Fourier component analysis, power spectrum density descriptors, or by establishing a threshold signature. These mathematical descriptors are, in general, known by those skilled in the art. Fourier algorithms can be found in various textbooks, such as for example, Advanced Engineering Mathematics by C. Ray Wiley and Lewis C. Barrett, McGraw Hill, 1982. A description of power spectrum density can be found in an article entitled, "Scatterometry Applied to Microelectronics Processing—Part 1," by J. R. McNeil et al, published in Solid State Technology, March 1993, p. 29.

Other mathematical descriptors and case representation methods may be used to identify the signal. It is important to note that in the preferred embodiment of the present invention, a method is used to mathematically describe a signal, and the description is stored in a database so that it may be used to compare it to the current signal to determine the closest correlated offset to apply to the current signal. This technique of using the database or feedback improves the alignment process.

Figure 3:
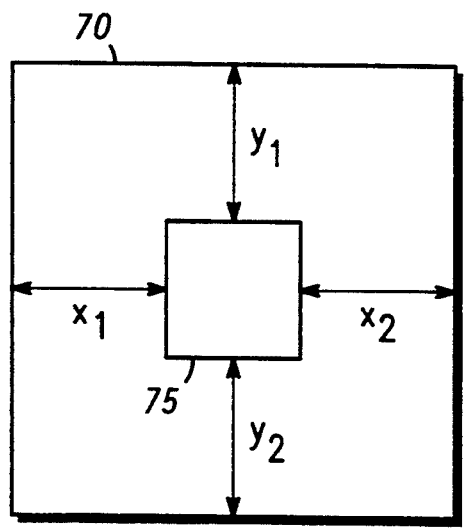
FIG. 3 illustrates a top view of an embodiment of a target used in the present invention.

FIG. 3 shows an embodiment of a pad-on-pad construction of an overlay target, used to determine alignment overlay errors or offsets. Offsets in the x direction are represented by the equation $dx=(x_1-x_2)/2$ and in the y direction are represented by the equation $dy=(y_1-y_2)/2$. In this embodiment, a larger pad 70 is patterned on the previous device layer to which current alignment is taking place. After alignment and exposure, a smaller pad 75 will be placed on larger pad 70. A perfect overlay, i.e., zero alignment overlay error, occurs when smaller pad 75 is perfectly centered on larger pad 70. That means $x_1=x_2$ and $y_1=y_2$, so $dx=0$ and $dy=0$.

The dimensions $x_1$, $x_2$, $y_1$, and $y_2$ on the pad-on-pad overlay target shown in FIG. 3 are typically measured using an optical measuring tool built for that purpose. This tool can be directly incorporated into the alignment system or interfaced with the alignment system. Analogous constructions can be made for overlay targets that can be measured manually using an optical microscope, without relying on other instrumentation, or for electrical probe, etc.

A storage and retrieval system for a library of signal shapes and sizes would be maintained. This storage and retrieval system allows for the use of feedback of previous alignment results to improve the current alignment. During alignment, the goal in step 144 is to return the most similar past signal case in the library that is relevant to the current input alignment signal. Exact signal matches would yield exact correlated offset values from the library. If there is not an exact match, the correlated offset can be estimated by interpolation between corresponding values of two or more most closely related library signals. In step 146, the correlated offset of the library signal is applied to the alignment signal. Unique alignment signals not already entered in the library system along with their correlated offset information would become new entries in step 148.

Referring back to FIG. 1, the total correction of the alignment processing 50 includes the summation or combination of positional calculations based on the conventional symmetric calculation performed in step 39 plus a correction term based on asymmetric signal analysis performed in step 40. A means for calculating a total correction based on a combination of the symmetrical analysis and the asymmetrical analysis is coupled to the lithographic tool. This means can be accomplished by software methods. The total correction is calculated and this positional information is actuated by the lithographic tool.

In the past, signal asymmetry position effects were never explicitly accounted for, so positional alignment errors were introduced by just performing the conventional calculation as if the alignment signal were perfectly symmetric, which it often was not. This invention reduces alignment errors by directly taking into account the asymmetry of the alignment signal.

If there are more sites for alignment in step 53, then the stage of the alignment system steps to the next site in step 56 to begin the whole process over again. If there are no more alignment sites in step 53, then the alignment job is completed in step 59.

This invention is applicable to all known lithographic exposure systems now made. This includes, among others, brightfield alignment systems, darkfield alignment systems, and phase grating type systems. Brightfield systems illuminate a target and all scattered light, including 0th order diffracted light, is collected by the optics for processing. Darkfield systems illuminate a target but the 0th diffracted order light is not collected. Also, an aperture can restrict light collection to 1 or more diffraction orders only. Phase grating systems act as darkfield systems where typically only the ±1 order diffracted light is collected.

Because this invention deals, not with the optical system of signal collection, but with signal processing, it is universally applicable to all alignment systems and can be used to minimize signal asymmetry impact-on alignment offset errors.

I claim:

1. A method of alignment, comprising the steps of:
   providing a lithographic tool;
   illuminating a target with a light generated from the lithographic tool;
   collecting an amount of light diffracted off the target to obtain a signal having positional information about the target;
   processing the signal to obtain a symmetrical analysis of the signal;
   processing the signal to obtain an asymmetrical analysis of the signal;
   calculating a correction based on a combination of the symmetrical analysis and the asymmetrical analysis; and
   actuating the lithographic tool according to the correction.

2. The method of claim 1 wherein the step of processing the signal to obtain an asymmetrical analysis of the signal further comprises the steps of:
   creating a library having a plurality of library signals, each having a correlated offset;
   matching the signal with a closest match to one of the plurality of library signals;
   applying the correlated offset of the library signal to the signal; and
   adding the signal and the correlated offset to the library if it is different than any of the plurality of library signals.

3. The method of claim 2 further comprising the step of:
   interpolating between a number of most closely matched of the plurality library signals when an exact match between the signal and one of the plurality of library signals is not found.

4. The method of claim 1 wherein the step of processing the signal to obtain an asymmetrical analysis of the signal further comprises the steps of:
   utilizing a mathematical expression for the signal shape.

5. The method of claim 1 wherein the step of processing the signal to obtain an asymmetrical analysis of the signal further comprises the steps of:
   utilizing a system to identify the signal by Fourier transform, Fourier component analysis, power spectrum density description, or threshold centroid signature.

6. The method of claim 1 wherein the step of processing the signal to obtain an asymmetrical analysis of the signal further comprises the steps of:
   obtaining the asymmetrical analysis of the signal by artificial intelligence.

7. The method of claim 1 wherein the step of processing the signal to obtain an asymmetrical analysis of the signal further comprises the steps of:
   providing information related to at least one previous signal;
   utilizing the information to obtain the asymmetrical analysis of the signal.

8. A method of alignment, comprising the steps of:
   providing a lithographic tool;
   illuminating a target with a light generated from the lithographic tool;
   collecting an amount of light diffracted off the target to obtain a signal having positional information about the target;
   symmetrically processing the signal;
   asymmetrically processing the signal by using a case-based method;
   calculating a correction based on a combination of the symmetrical processing and the asymmetrical processing; and
   actuating the lithographic tool according to the correction.

9. The method of claim 8 wherein the step of asymmetrically processing the signal by using a casebased method further comprises the steps of:
   creating a library having a plurality of library signals, each having a correlated offset;
   matching the signal with a closest match to one of the plurality of library signals;
   applying the correlated offset of the library signal to the signal; and
   adding the signal and the correlated offset to the library if it is different than any of the plurality of library signals.

10. The method of claim 9 further comprising the step of:
    interpolating between a number of most closely matched of the plurality library signals when an exact match between the signal and one of the plurality of library signals is not found.

11. An alignment system, comprising:
    a lithographic tool;
    a means for processing a signal to obtain a symmetrical analysis of the signal coupled to the lithographic tool;
    a means for processing the signal to obtain an asymmetrical analysis of the signal coupled to the lithographic tool;
    a means for calculating a total correction based on a combination of the symmetrical analysis and the asymmetrical analysis coupled to the lithographic tool; and
    a means for actuating the lithographic tool according to the total correction.

* * * * *